(12) United States Patent
Yamae et al.

(10) Patent No.: US 8,399,272 B2
(45) Date of Patent: Mar. 19, 2013

(54) METHOD OF MANUFACTURING SEMICONDUCTOR LIGHT EMITTING ELEMENT

(75) Inventors: Kazuyuki Yamae, Ikoma (JP); Hiroshi Fukshima, Kadoma (JP); Masaharu Yasuda, Takarazuka (JP); Tomoya Iwahashi, Ibaraki (JP); Hidenori Kamei, Kagoshima (JP); Syuusaku Maeda, Kagoshima (JP)

(73) Assignee: Panasonic Corporation, Kadoma-shi (JP)

( * ) Notice: Subject to any disclaimer, the term of this patent is extended or adjusted under 35 U.S.C. 154(b) by 0 days.

(21) Appl. No.: 12/998,521

(22) PCT Filed: Oct. 27, 2009

(86) PCT No.: PCT/JP2009/068366
§ 371 (c)(1),
(2), (4) Date: Jul. 18, 2011

(87) PCT Pub. No.: WO2010/050451
PCT Pub. Date: May 6, 2010

(65) Prior Publication Data
US 2011/0263058 A1 Oct. 27, 2011

(30) Foreign Application Priority Data
Oct. 28, 2008 (JP) .................. 2008-277315

(51) Int. Cl.
*H01L 21/786* (2006.01)
(52) U.S. Cl. .......... 438/33; 438/47; 438/464; 257/E21.6
(58) Field of Classification Search .............. 438/33, 438/42, 47, 464, 796; 257/E21.6
See application file for complete search history.

(56) References Cited

U.S. PATENT DOCUMENTS

| 6,303,405 B1 | 10/2001 | Yoshida et al. |
| 6,455,340 B1 * | 9/2002 | Chua et al. ............. 438/31 |

(Continued)

FOREIGN PATENT DOCUMENTS

| JP | 08-124879 A | 5/1996 |
| JP | 10-214997 A | 8/1998 |

(Continued)

OTHER PUBLICATIONS

International Search Report for International Application No. PCT/JP2009/068366 issued Dec. 1, 2009.

(Continued)

*Primary Examiner* — George Fourson, III
(74) *Attorney, Agent, or Firm* — Edwards Wildman Palmer LLP (57) ABSTRACT

A method of manufacturing the semiconductor light emitting element comprises a semiconductor layer forming step of forming the multilayered nitride semiconductor layer on the first wafer having a transparent property; a bonding step of bonding the multilayered nitride semiconductor layer to the first wafer; a groove forming step of forming the groove extending from the lower surface of the first wafer to the multilayered nitride semiconductor layer; a light applying step of applying a first light to the lower surface of the multilayered nitride semiconductor layer through the first wafer to reduce a bonding force between the multilayered nitride semiconductor layer and the first wafer; a separating step of separating the first wafer from the multilayered nitride semiconductor layer; and a cutting step of cutting the second wafer along the groove to divide into a plurality of the semiconductor light emitting element.

20 Claims, 6 Drawing Sheets

U.S. PATENT DOCUMENTS

| | | | |
|---|---|---|---|
| 6,667,252 B2 | 12/2003 | Miyajima et al. | |
| 7,001,824 B2 * | 2/2006 | Hon et al. | 438/455 |
| 7,015,117 B2 * | 3/2006 | Urbanek | 438/458 |
| 7,560,294 B2 * | 7/2009 | Suehiro et al. | 438/22 |
| 7,709,282 B2 * | 5/2010 | Fukshima et al. | 438/26 |
| 8,030,102 B2 * | 10/2011 | Lai | 438/22 |
| 8,252,662 B1 * | 8/2012 | Poblenz et al. | 438/458 |
| 2002/0146912 A1 | 10/2002 | Miyajima et al. | |
| 2007/0298529 A1 * | 12/2007 | Maeda et al. | 438/33 |
| 2008/0142809 A1 | 6/2008 | Jang et al. | |
| 2008/0261341 A1 * | 10/2008 | Zimmerman et al. | 438/33 |
| 2009/0294784 A1 | 12/2009 | Nakahara et al. | |
| 2010/0055819 A1 * | 3/2010 | Ohba et al. | 438/47 |
| 2010/0163908 A1 | 7/2010 | Jang et al. | |
| 2011/0136324 A1 * | 6/2011 | Ashdown et al. | 438/464 |
| 2011/0229997 A1 * | 9/2011 | Akaike et al. | 438/33 |
| 2011/0263058 A1 * | 10/2011 | Yamae et al. | 438/33 |
| 2012/0244683 A1 * | 9/2012 | Akagi | 438/464 |

FOREIGN PATENT DOCUMENTS

| | | |
|---|---|---|
| JP | 11-163403 A | 6/1999 |
| JP | 3518455 | 2/2004 |
| JP | 3525061 | 2/2004 |
| JP | 3795765 | 4/2006 |
| JP | 2007-134415 A | 5/2007 |
| JP | 2007-299935 A | 11/2007 |
| KR | 10-0710394 B1 | 4/2007 |

OTHER PUBLICATIONS

Office Action dated Aug. 20, 2012, issued for the counterpart Korean patent application.

Office Action mailed Jan. 8, 2013, issued for the Japanese counterpart patent application No. 2008-277315.

* cited by examiner

METHOD OF MANUFACTURING SEMICONDUCTOR LIGHT EMITTING ELEMENT

TECHNICAL FIELD

This invention relates to a method of manufacturing semiconductor light emitting element.

BACKGROUND ART

Conventionally, the semiconductor light emitting element having a property of emitting the light having a emitting area from green to ultraviolet is researched. Such the semiconductor light emitting element is exemplified by a light emitting diode (LED) and a laser diode (LD). Such the light emitting diode and the laser diode are made of nitride semiconductor material of GaN type as follows.

$Al_x In_y Ga_z B_u N$
 $0 \leq x \leq 1$
 $0 \leq y \leq 1$
 $0 \leq z \leq 1$
 $0 \leq u \leq 1$
x+y+z+u=1

The semiconductor light emitting element such as blue light emitting diode and the ultraviolet light emitting diode are used in combination with the phosphor. The blue light emitting diode and the ultraviolet light emitting diode are configured to emit the blue light and the ultraviolet light, respectively. The blue light and the ultraviolet light are converted into the white light by the phosphor. In addition, the lighting device comprising the blue light emitting diode and the ultraviolet light emitting diode which is used in combination with the phosphor is also researched.

In a case where the semiconductor light emitting element which is made of the nitride semiconductor material of GaN type is manufactured, the substrate for crystalline growth is used. The substrate for crystalline growth is required to have a heat resistance property. In addition, the substrate for crystalline growth is required to have a coefficient of thermal expansion which is close to a coefficient of thermal expansion of the nitride semiconductor material. In light of this requirement, the sapphire wafer is used as the substrate for the crystalline growth. However, the sapphire wafer generally has a low electrical conductivity and a low heat conductivity. In addition to the above property, the sapphire wafer is hard. In addition, the sapphire wafer has low cleavage property. Therefore, the device having a semiconductor light emitting element comprising the sapphire wafer is limited its shape. In addition to the above limitation, the device having the semiconductor light emitting element comprising the sapphire substrate is required to be designed such that the device efficiently radiates the heat. That is to say, in order to emit a large amount of the light from one semiconductor light emitting element, there is a requirement to supply a large amount of the electrical current to the semiconductor light emitting element. When the semiconductor light emitting element receives a large amount of the electrical current, the semiconductor light emitting element generates a large amount of heat. Therefore, the device is required to have a design for effective heat radiation. In view of this requirement, conventionally, the sapphire wafer is polished to be thinned. In addition, conventionally, the sapphire wafer is removed from the nitride semiconductor. Specifically, first, the buffer layer is prepared on the upper surface of the sapphire wafer. The buffer layer is, for example, GaN which is grown under a condition of low temperature. Subsequently, the crystalline growth of the n-type nitride semiconductor layer is made on the upper surface of the buffer layer. Subsequently, the crystalline growth of the p-type nitride semiconductor layer is made on the upper surface of the n-type nitride semiconductor layer. Subsequently, the upper surface of the p-type nitride semiconductor layer is bonded with the supporting wafer. Subsequently, the laser beam such as the ultraviolet light is applied to the buffer layer through the sapphire wafer. Consequently, the sapphire wafer is separated from the n-type nitride semiconductor layer. Such the method of manufacturing the semiconductor light emitting element is researched.

However, the sapphire wafer has a coefficient of thermal expansion which is different from the coefficient of the thermal expansion of the nitride semiconductor layer. Therefore, in a case where the sapphire wafer is polished to be thinned, the nitride semiconductor layer receives the stress which is caused by the difference between the coefficient of the thermal expansion of the sapphire wafer and the coefficient of the thermal expansion of the nitride semiconductor layer. The stress causes the warpage of the sapphire wafer and the multilayered nitride semiconductor layer. The warpage causes the crack of the sapphire wafer and the multilayered nitride semiconductor layer.

In addition to the above, when the sapphire wafer is separated from the multilayered nitride semiconductor layer, the laser beam is applied to the multilayered nitride semiconductor layer through the sapphire wafer. That is, the buffer layer of the multilayered nitride semiconductor layer receives the laser light. When the buffer layer receives the laser light, GaN is dissolved into Ga and N. When GaN is dissolved, $N_2$ is evolved. $N_2$ gas is evolved between the multilayered nitride semiconductor and the sapphire wafer. $N_2$ gas applies the gas pressure to the multilayered semiconductor layer. Therefore, the gas pressure of $N_2$ gas causes the crack of micrometer order to the multilayered nitride semiconductor layer. The crack causes the leakage of the electrical current. Therefore, the semiconductor light emitting element which is manufactured by the above has low yield ratio.

Japanese patent application publication No. 3518455B (hereinafter referred as to Patent literature 1) and No. 3795765B (hereinafter referred as to Patent literature 2) disclose the technical solution for solving the above problem. The patent literature 1 and the patent literature 2 disclose the step of preparing the space, in advance, to the boundary of the transparent crystal wafer and the nitride semiconductor layer. The space absorbs the gas pressure which is caused by $N_2$ which is evolved in a position between the transparent crystal wafer and the nitride semiconductor layer. Patent literature 1 and Patent literature 2 disclose the following steps. First, the foundation layer including the buffer layer which is a part of the multilayered nitride semiconductor layer is prepared by MOVPE method, whereby the buffer layer is made by the crystalline growth. The buffer layer is made of GaN. Subsequently, by the photolithograph and etching, patterning is made on the upper surface of the foundation layer and the sapphire wafer. Subsequently, the n-type nitride semiconductor layer and p-type nitride semiconductor layer is prepared on the upper surface of the buffer layer and the sapphire layer. The n-type nitride semiconductor layer and p-type nitride semiconductor layer are prepared by the crystalline growth of the epitaxial lateral overgrowth. Consequently, the space is formed in the boundary between the sapphire wafer and the multilayered nitride semiconductor layer. Subsequently, the laser beam is applied to the buffer layer through the sapphire wafer, whereby the sapphire wafer is removed. In addition, Japanese patent application publication No. 3525061 B (Patent literature 3) discloses the step of forming the irregularity to the upper surface of the photolithograph and the etching. In Patent literature 3, first, the irregularity is formed to the upper surface of the sapphire wafer. Subsequently, the nitride semiconductor layer is formed. Subsequently, the step of applying the laser beam to the nitride semiconductor layer through the sapphire wafer is performed. Consequently, the sapphire wafer is removed from the multilayered nitride semiconductor layer.

However, the method disclosed in Patent literature 1 and Patent literature 2 includes two steps of the crystalline growth. Therefore, in a case where the multilayered nitride semiconductor layer is manufactured according to the method disclosed in Patent literature 1 and Patent literature 2, there is a need to take a long manufacturing time. In addition to this need, this method required much cost. In addition, after the foundation layer is formed, the sapphire wafer is taken out from the chamber having a vacuum state. Subsequently, the first forming step of applying the treatment of the foundation layer. Subsequently, the second forming step of forming the semiconductor layer on the upper surface of the foundation layer in the chamber having the vacuum state, again. It should be noted that the sapphire wafer is taken out from the chamber having the vacuum state in the interval period between the first forming step and the second forming step. When the sapphire wafer is taken out to the outside, there is a possibility of that the impurity is adhered to the surface. As a result, there is a possibility of mixing the needless impurity with the multilayered nitride semiconductor layer. That is, when the sapphire wafer is taken out to the outside, there is a possibility of quality loss of the multilayered nitride semiconductor layer.

In addition, in Patent literature 3, the sapphire wafer is provided at its upper surface with an irregularity. In addition, the multilayered nitride semiconductor layer which includes the buffer layer is formed on the upper surface of the sapphire wafer. The multilayered nitride semiconductor layer is formed by the crystalline growth which is different from the epitaxial lateral overgrowth. That is, the irregularity of the sapphire wafer exerts the influence of the crystalline of the multilayered nitride semiconductor in the early step of the crystalline growth.

In view of the above problem, Japanese patent application publication No. 2007-299935A (hereinafter referred to as Patent literature 4) discloses another method of manufacturing the semiconductor light emitting element. Patent literature 4 discloses the step of forming a multilayered nitride semiconductor layer by the crystalline growth on the upper surface of the sapphire wafer. Subsequently, the groove forming step of forming the groove extending from the upper surface of the multilayered nitride semiconductor layer to the upper surface of the sapphire wafer is performed. Subsequently, the laser light is applied to the multilayered nitride semiconductor layer through the sapphire wafer. In this manner, the sapphire wafer is removed from the multilayered nitride semiconductor layer.

According to the manufacturing method disclosed in Patent literature 4, the crystalline of the multilayered nitride semiconductor layer is kept at high level. In addition, it is possible to prevent the generation of the crack of micrometer order due to $N_2$ gas which is evolved when the sapphire wafer is removed.

However, when the semiconductor light emitting element is manufactured by the method disclosed in Patent literature 4, the minute irregularity is formed adjacent to the groove when the groove is formed. The minute irregularity decreases the bonding force between the multilayered nitride semiconductor layer and the supporting wafer. Therefore, when the semiconductor light emitting elements are produced by the cutting, there is a possibility of degradation of the reliability of the bonding between the multilayered nitride semiconductor layer and the supporting wafer which is a part of the supporting substrate.

DISCLOSURE OF INVENTION

Problem to be Resolved by the Invention

This invention is achieved to solve the above problem. First object of this invention is to produce the method of manufacturing the semiconductor light emitting element prevents the generation of the crack of micrometer size in the multilayered nitride semiconductor layer. Second object in this invention is to produce the semiconductor light emitting element which includes the multilayered semiconductor layer which is bonded with the supporting substrate, securely.

Method of Solving the Problem

In order to solve the above problem, the method of manufacturing the semiconductor light emitting element comprises the a semiconductor layer forming step, a bonding step, a groove forming step, a light applying step, a separating step, and a cutting step. In the semiconductor layer forming step, the multilayered nitride semiconductor layer is formed on the surface of the first wafer. The first wafer is configured to pass the first light. The first wafer has a first surface and a second surface. The second surface is opposite of the first surface. The multilayered nitride semiconductor layer has a first nitride semiconductor layer and the second nitride semiconductor layer. The first nitride semiconductor layer has a type of n-type or p-type. The second nitride semiconductor layer is disposed on the first nitride semiconductor layer. The second nitride semiconductor layer has a type which is opposite of the type of the first nitride semiconductor layer. The multilayered nitride semiconductor layer has a third surface which is faced to the first surface. The bonding step is performed after the semiconductor layer forming step. In the bonding step, the multilayered nitride semiconductor layer is bonded with the multilayered nitride semiconductor layer. The groove forming step is performed after the bonding step. In the groove forming step, the groove having a depth extending from the second surface of the first wafer to at least the multilayered nitride semiconductor layer is formed. The light applying step is performed after the groove forming step. In the light applying step, the first light is applied to the lower surface of the multilayered nitride semiconductor layer through the first wafer. Consequently, a nitride semiconductor in the third surface of the multilayered nitride semiconductor layer is dissolved. When the nitride semiconductor in the third surface of the multilayered nitride semiconductor layer is dissolved, the nitrogen gas is generated. The nitrogen gas is discharged to the outside through the groove. In addition, when the nitride semiconductor in the third surface of the multilayered nitride semiconductor layer is dissolved, the bonding force between the multilayered nitride semiconductor layer and the first wafer is decreased. The separating step is performed after the light applying step. In the separating step, the first nitride semiconductor layer is separated from the first wafer. The cutting step is performed after the separating step. In the cutting step, the first nitride semiconductor layer, the second nitride semiconductor, and the second wafer are cut along the groove. Consequently, each one of the semiconductor light emitting element are divided independently.

In this case, N₂ gas generated in the light applying step is discharged through the groove. Therefore, it is possible to prevent the generation of the crack in the multilayered nitride semiconductor layer. In addition, in the groove forming step, the groove is formed after the multilayered nitride semiconductor layer and the supporting wafer are joined. When the multilayered nitride semiconductor layer is cut to be divided, a plurality of the semiconductor light emitting element comprising a supporting substrate and the multilayered nitride semiconductor on the supporting substrate are obtained. In this case, it is possible to obtain the semiconductor light emitting element comprising the multilayered nitride semiconductor layer and the supporting substrate are securely joined.

It is preferred to form the groove having the depth which reaches the second wafer when the groove is formed.

In this case, it is possible omit a new groove forming step of forming the groove to the second wafer. Therefore, it is possible to easily obtain a plurality of the semiconductor light emitting element which is divided.

It is preferred to use the laser beam when the groove is formed.

In this case, it is possible to form the groove at a short time, compared with a case where the groove is formed by the dicing saw. In addition, it is possible to form the groove having the width which is smaller than the width which is formed by the dicing saw. Consequently, it is possible to manufacture a lot of the semiconductor light emitting element from a second wafer. As a result, it is possible to reduce the cost of the semiconductor light emitting element.

It is preferred to apply the first light to an area spaced from the groove by a predetermined distance when the first light is applied.

In the groove forming step, there is a possibility of generating the leak path causation of leaking the electrical current on the inside surface of the groove. However, in this case, it is possible to remove the first wafer with the portion with the leak path causation by the separating step.

It is preferred that the method of manufacturing the semiconductor light emitting element in this invention further comprises an electrical insulation film forming step. The electrical insulating film forming step is performed after the first wafer is separated from the multilayered nitride semiconductor layer. In the electrical insulation film forming step, the electrical insulation film is formed on the inside surface of the groove. The cutting step is performed after the electrical insulation film forming step.

In this case, it is possible to prevent "the side surface of the multilayered nitride semiconductor layer of the semiconductor light emitting element after cutting" from being exposed to the air. Consequently, it is possible to prevent the foreign matter from adhering the side surface of the multilayered nitride semiconductor layer. As a result, it is possible to prevent the leakage of the electrical current of the semiconductor light emitting element.

It is preferred that the second wafer has a plurality of the element forming areas and the scribe lane area. One of the element forming areas are spaced from the other of the element forming area by the scribe lane. In the groove forming step, the groove is formed along the center line which passes the width center of the scribe lane area.

It is preferred that the multilayered nitride semiconductor layer further comprises the buffer layer. The buffer layer is made of the nitride semiconductor. The buffer layer is located on the first wafer. The first nitride semiconductor layer is located on the buffer layer. The buffer layer has the lower surface opposite of the upper surface of the buffer layer, and is defined as the third surface of the multilayered nitride semiconductor layer.

It is preferred that the buffer layer is made of gallium nitride. In addition, it is preferred that the first light is an ultraviolet light.

It is preferred that the multilayered nitride semiconductor layer comprises a plurality of the first areas and a second area. A plurality of the first areas corresponds to the semiconductor light emitting element. The second area is configured to space one of the first areas from the other of the first areas. The first light is applied to the first area so as not to be applied to the second area. The second area has a non-light-applied-width which has a center corresponding to the width center of the groove. The second area has the non-light-applied-width which is greater than the width of the groove.

BRIEF EXPLANATION OF DRAWINGS

FIG. 1 (a) to FIG. 1 (g) show side cross sectional views each indicating the method of manufacturing the semiconductor light emitting element in the first embodiment.

FIG. 2 (a) to FIG. 2 (b) shows side cross sectional views each indicating the method of manufacturing the semiconductor light emitting element in the second embodiment.

FIG. 3 (a) to (d) shows a side cross sectional views each indicating the method of manufacturing the semiconductor light emitting element in the third embodiment.

FIG. 6 (a) to FIG. 6 (d) shows a cross sectional view indicating the method of manufacturing the semiconductor light emitting element in the fourth embodiment.

BEST MODE FOR CARRYING OUT THE INVENTION

First Embodiment

This embodiment discloses the semiconductor light emitting element A. The semiconductor light emitting element A is a light emitting diode which is made of a nitride semiconductor material. It should be noted that the supporting wafer is turned back in the mid step of the method of manufacturing the semiconductor light emitting element A. Therefore, in order to make easily explanation, the explanation is made with FIG. 1(a) to FIG. 1(g) which has an upper direction which is indicated by an arrow. FIG. 1 (g) shows a side cross sectional view of the semiconductor light emitting element A. As will be understood from FIG. 1 (g), the semiconductor light emitting element A comprises the supporting substrate 3, the multilayered nitride semiconductor layer 2, the cathode electrode 42, and the anode electrode 44. The supporting substrate is made of silicon. The multilayered nitride semiconductor layer 2 comprises the p-type nitride semiconductor layer 24, the light emission layer 23, and the n-type nitride semiconductor layer 22. That is, p-type nitride semiconductor layer includes the dopant which has a type opposite of a type of the dopant which is doped to the n-type nitride semiconductor layer. The anode electrode 44 is formed on the upper surface of the supporting substrate 3. p-type nitride semiconductor layer is formed on the upper surface of the anode electrode 44. In addition, the p-type nitride semiconductor layer is bonded with an upper surface of the supporting substrate 3. The light emission layer 23 is disposed on the upper surface of the p-type nitride semiconductor layer. n-type nitride semiconductor layer is disposed on the upper surface of the light emission layer 23. The cathode electrode 42 is disposed on the upper surface of the n-type nitride semiconductor layer.

Figure 1A:
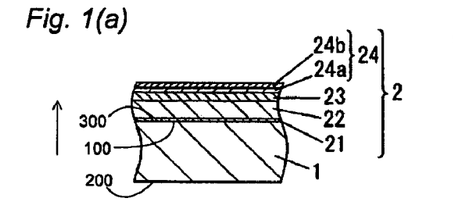
Figure 1B:
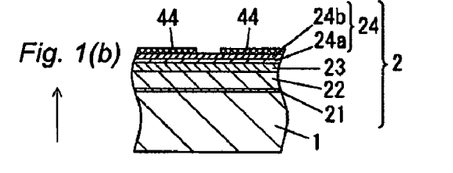
Figure 1C:
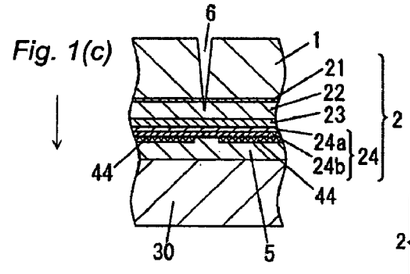
Figure 1D:
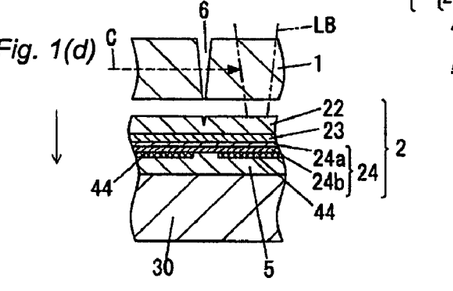
Figure 1E:
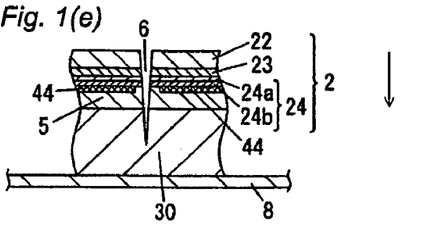
Figure 1F:
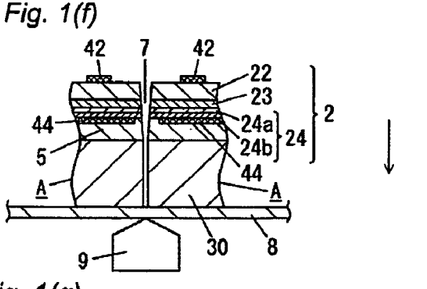
Figure 1G:
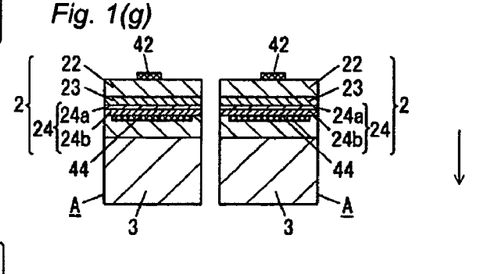

The light emitting diode in this embodiment is a blue light emitting diode. n-type nitride semiconductor layer 22 is realized by n-type GaN that the n-type dopant is doped. n-type dopant is exemplified by Si. The light emission layer 23 includes the single quantum well structure. In this single quantum well structure, the barrier layer and the well layer are stacked alternately. The barrier layer is made of GaN. The well layer is made of InGaN. p-type nitride semiconductor layer 24 comprises p-type AlGaN layer 24a and p-type GaN layer 24. p-type AlGaN layer 24a includes the p-type dopant. P-type GaN layer includes p-type dopant. In addition, p-type dopant is exemplified by Mg and Zn. In this embodiment, n-type nitride semiconductor layer 24 has a thickness of 2000 nm. The light emission layer 23 has a thickness of 50 nm. The p-type nitride semiconductor layer 24 has a thickness of 100 nm. However, the numerical values of the above are understood as one example. However, the thicknesses are not limited to the above. In addition, the structure of the layer of each one of n-type nitride semiconductor layer 22, the light emission layer 23, p-type nitride semiconductor layer is not limited to the above. That is to say, n-type nitride semiconductor layer 22, the light emission layer 23, and the p-type nitride semiconductor layer are changed its material, the composition, and the structure arbitrarily. For example, it is possible to employ n-type nitride semiconductor layer 22 which includes n-type GaN layer and n-type AlGaN which has a bandgap energy which is greater than the bandgap energy of the n-type GaN. This configuration makes it possible to improve the confinement effect of the carrier, whereby the recombination of the electron and the hole in the light emission layer 23 is enhanced. As a result, internal quantum efficiency is improved. In addition to the above modification, it is possible to employ the light emission layer having the single quantum well structure and the single layer structure, instead of the light emission layer 23 explained in the above.

The cathode electrode 42 comprises Ni film, Ti film, and Au film. Ni film is formed on the upper surface of the n-type nitride semiconductor layer 22. Ti film is formed on the upper surface of the Ni film. Au film is formed on the upper surface of the Ti film. The material of the cathode electrode 42 and the layer structure of the cathode 42 are explained as one example. Therefore, the material of the cathode electrode 42 and the layer structure of the cathode 42 are not limited to the above.

In addition, the anode electrode 44 comprises Pd film and Au film. Pd film is formed on the upper surface of the p-type nitride semiconductor layer 24. Au film is formed on Pd film. However, the material of the anode electrode 44 and the layer structure of the anode 44 are explained as one example. Therefore, the material of the anode electrode and the layer structure of the anode electrode are not limited. In addition, the shapes of the cathode electrode 42 and the anode electrode 44 may be varied according to the design of the semiconductor light emitting element A. However, in this embodiment, n-type nitride semiconductor layer 22 comprises "a surface which mounts the cathode electrode 42" and "a light emission surface other than the surface which mounts the cathode electrode 42". Therefore, it is preferred that a size of the cathode electrode 42 is sufficiently smaller than the size of an upper surface of the n-type nitride semiconductor layer 22.

The supporting substrate 3 is made of Si. However, the material of the supporting substrate 3 is not limited to Si. It is preferred that the supporting substrate 3 has a coefficient of thermal conductivity which is higher than the coefficient of thermal conductivity of the transparent crystal wafer 1. In addition, it is preferred that the supporting substrate 4 has a stiffness property which is greater than the stiffness property of the transparent crystal wafer 1. The material which satisfies the above requirements is exemplified by Si, Cu, CuW, and Ge.

In addition, p-type nitride semiconductor layer 24 is provided at its lower surface with an anode electrode 44. In addition, the multilayered nitride semiconductor layer 2 and the supporting substrate 3 are joined with the bonding layer 5 which is made of electrical conductive material. It is preferred that the bonding layer 5 is made of lead free solder such as SnAgCu and AuSn. However, the material of the bonding layer 5 is not limited to the lead free solder. The bonding layer 5 may be made of the material of metal such as Au, Sn, Ag, and Cu. In addition, as to the bonding layer 5, it is possible to use arroy which includes at least one of Au, Sn, Ag, and Cu. Furthermore, in this embodiment, the bonding layer 5 is made of the electrical conductive material. However, in a case where "a step of etching a part of the n-type nitride semiconductor layer 22 and a part of the light emission layer 23 from the multilayered nitride semiconductor layer 2 to expose a part of the upper surface of the p-type nitride semiconductor layer, a step of forming a cathode electrode on the upper surface of the multilayered nitride semiconductor layer 2, and a step of forming the anode electrode 44 on the lower surface of the multilayered nitride semiconductor layer" are performed, it is possible to employ the bonding layer which is made of resin. That is, considering the heat radiation property and joint strength, the bonding layer 5 is made of electrical conductive material or resin.

Hereinafter, the method of manufacturing the semiconductor light emitting element is explained on the basis of FIG. 1.

First, the transparent crystal wafer 1 is prepared. The transparent crystal wafer 1 is made from the sapphire wafer having upper surface having a (0001) face. The transparent crystal wafer 1 is defined as a first wafer. In addition, the transparent crystal wafer 1 has a first surface 100, and a second surface 200. The first surface 100 is defined as an upper surface of the transparent crystal wafer 1. The second surface 200 is opposite of the first surface 100. That is to say, the transparent crystal wafer 1 is defined as a lower surface of the transparent crystal wafer 1. The buffer layer 21 is made of GaN, and is provided on the upper surface of the transparent crystal wafer by MOVPE method, whereby the buffer layer 21 is formed by the epitaxial growth. Subsequently, n-type nitride semiconductor layer 22 made of n-type GaN is formed on the upper surface of the buffer layer 21 by the MOVPE method, whereby the n-type nitride semiconductor layer 22 is formed by the epitaxial growth. Subsequently, the light emission layer 23 is formed on the upper surface of the n-type nitride semiconductor layer, whereby the light emission layer 23 is formed by the epitaxial growth. The light emission layer 23 has a barrier layer which is made of GaN and a well layer which is made of InGaN. Therefore, the light emission layer 23 has a single quantum well structure. Subsequently, p-type nitride semiconductor layer 24 which comprises p-type AlGaN layer 24a and p-type GaN layer 24b is formed by the MOVPE method, whereby p-type nitride semiconductor layer 24 is formed by the epitaxial growth. According to the semiconductor layer forming step of forming "the buffer layer, n-type nitride semiconductor layer 22, the light emission layer 23, and p-type nitride semiconductor layer 24", the multilayered nitride semiconductor layer 2 is formed on the upper surface of the transparent crystal wafer 1, as shown in FIG. 1 (a). As shown in FIG. 1 (a), the multilayered nitride semiconductor layer 2 has a lower surface. The lower surface is defined as a third surface 300. The third surface 300 is faced with the first surface 100. Specifically, the buffer layer has a lower surface which is defined as a third surface 300. The buffer layer 21 is provided for (a) reduction of the threading dislocation in the n-type nitride semiconductor layer 22 due to the mismatch of the lattice constant between the transparent crystal wafer 1 and n-type nitride semiconductor layer 22, and (b) reduction of residual strain of the n-type nitride semiconductor layer 22. In this embodiment, the buffer layer 21 is made of GaN. However, the buffer layer 21 is not limited its material to GaN. The buffer layer may be made of material such as AlN and AlGaN. It should be noted that this embodiment employs the transparent crystal wafer which is made of $Al_2O_3$. However, the transparent crystal wafer is not limited its material to $Al_2O_3$. The transparent crystal wafer 1 may be made of material such as SiC, $MgAl_2O_4$, ZnO, MgO, GaP, GaAs. In addition to the above mentioned matter, in the semiconductor layer forming step, the method of forming the multilayered nitride semiconductor layer is not limited to MOVPE method. The step of forming the multilayered nitride semiconductor layer in the semiconductor layer forming step is performed by the epitaxial growth method which is exemplified by hydride vapor phase epitaxial method (HVPE method), molecule beam epitaxial method (MBE method), liquid phase growth epitaxial method (LPE method)

After the semiconductor layer forming step, activation annealing step of annealing p-type nitride semiconductor layer 24 is performed. In the activation annealing step, the multilayered nitride semiconductor layer is annealed in the nitrogen atmosphere by the lamp annealing apparatus under a condition of a predetermined temperature (for example, 750 degree C.), and a predetermined period of time (for example, five minutes). According to this activation annealing step, the hydrogen which is coupled with the p-type dopant of the p-type nitride semiconductor layer 24 is removed. Removing the hydrogen from the p-type dopant results in the activation of the p-type dopant.

After the activation annealing step, the first electrode forming step of forming the anode electrode 44 on the upper surface of the multilayered nitride semiconductor layer 2 is performed. According to the first electrode forming step, as will be understood from FIG. 1 (b), the anode electrode is formed on the upper surface of the multilayered nitride semiconductor layer 2. The anode electrode 44 is prepared as follows. First, according to the photolithography technique, the multilayered nitride semiconductor layer 2 is provided at is upper surface with a first resist layer having a pattern which exposes an area on which the anode electrode is to be formed. Subsequently, the anode electrode 44 is formed with the electron beam evaporation method. Subsequently, the first resist layer and the film on the first resist layer are removed by the liftoff process. In this manner, the anode electrode 44 is prepared on the upper surface of the multilayered nitride semiconductor layer 2. The semiconductor light emitting element A has a supporting substrate 3 having a diameter of square millimeter. The anode electrode 44 has a shape of rectangular tetragon which is smaller than the supporting substrate 3. When the first electrode forming step is completed, the multilayered nitride semiconductor layer 2 is provided at its upper surface with anode electrode 44 which are arranged in a matrix. The anode electrode 44 is spaced from the adjacent anode electrode 44 by 1 mm.

Next, the bonding step of joining the upper surface of the multilayered nitride semiconductor layer 2 and the lower surface of the supporting wafer 30 made of silicon is performed. The supporting wafer 30 is defined as the second wafer. In the bonding step, the multilayered nitride semiconductor and the supporting wafer 30 are joined with the bonding layer 5 which is made of electrical conductive material (for example, lead-free solder such as SnAgCu). Specifically, first, SnAgCu paste is applied on the lower surface of the supporting wafer 30. Subsequently, the multilayered nitride semiconductor layer 2 and the supporting wafer 30 are arranged such that SnAgCu paste is interposed between the supporting wafer 30 and the multilayered nitride semiconductor layer 2. Subsequently, the multilayered nitride semiconductor layer 2 and the supporting wafer 30 are passed through the reflow furnace under a condition of a predetermined temperature (for example, 270 degree C.) and a predetermined period of time (for example, 10 minutes.) Consequently, the multilayered nitride semiconductor layer 2 and the supporting wafer 30 are joined in the reflow furnace. As a result, the supporting wafer 30 and the multilayered nitride semiconductor layer 2 are joined by the highly coupled force. In addition, the bonding layer has a uniform thickness (20±5 μm).

Subsequently, the supporting wafer 30 is turned back. Then, the groove forming step of forming the groove which extends from the lower surface of the transparent crystal wafer 1 to the multilayered nitride semiconductor layer 2 is performed. This groove is formed along a center line which passes the width center of the area corresponding to the scribe lane. Consequently, as shown in FIG. 1 (c), the transparent crystal wafer and the multilayered nitride semiconductor layer 2 with groove is prepared. Specifically, in the groove forming step, the laser beam of THG-YAG laser having the wavelength of 355 nm, the frequency of 10 kHz, the output power of 5 W, the pulse width of 30 nano second is applied, and swept (for example, 1 mm/s). Consequently, the groove having a depth of 350 μm and the width of 40 μm is formed. It is noted that the width and depth of the groove is not limited to the above condition of the width and depth. In addition, in the groove forming step in this embodiment, the groove is formed to extend from the lower surface of the transparent crystal wafer 1 to the multilayered nitride semiconductor layer 2. Specifically, the groove has a depth which is greater than the thickness of the transparent crystal wafer 1, whereby the groove extends from the lower surface of the transparent wafer 1 to n-type nitride semiconductor layer. Therefore, there is a need to apply "the laser beam having an energy which is greater than the energy of the laser beam which is applied to the multilayered nitride semiconductor layer when the groove is formed in the upper surface of the multilayered nitride semiconductor layer 2" to the transparent crystal wafer. Therefore, in order to prevent the influence of the heat applied to the inner circumference of the groove and the expanse of the width of the groove, it is preferred to polish the transparent crystal wafer 1 to leave the thickness of 100 nm to the transparent crystal wafer. In contrast, in case where the transparent crystal wafer 1 is polished to the thickness of less than 100 nm, handling performance is worsened. In addition to the above problem, in the case where the transparent crystal wafer is polished to the thickness of less than 100 nm, there is a possibility of causing the crack to the multilayered nitride semiconductor layer 2 due to the warpage of the multilayered nitride semiconductor layer 2.

It is noted that the groove forming step employs the THG-YAG laser as the laser beam for forming the groove. THG-YAG laser is an ultraviolet laser beam. Therefore, it is possible to focus the THG-YAG laser to form the focal point having a diameter which is smaller than a diameter of the focused visible light. Therefore, the energy density per unit in the focal point is increased. As a result, it is possible to reduce the process area. In addition, according to the usage of the pulse laser beam, it is possible to obtain the peak value of the energy per unit area for sufficiently process the transparent crystal wafer 1. The pulse laser light has an output power of 3 W, and frequency of 10 kHz. Therefore, if the laser beam having a diameter ϕ of 30 μm, the energy peak value per unit area is calculated by the following formula. "3/10000/(π× 0.0015×0.0015)" Therefore, the energy peak per unit area is calculated as 42 J/cm$^2$. In addition, if the pulse laser beam is used, it is possible to reduce the affection of the heat applied to the semiconductor light emitting element A as much as possible. In addition, it is preferred to employ the laser light having the small pulse width. That is to say, the laser beam used in the groove forming step is not limited to THG-YAG laser. It is possible to use the laser beam such as the KrF excimer laser of femtosecond. (Wavelength: 248 nm, Frequency: 350 kHz, Pulse width: 800 femtosecond) This laser has a high output power, a short wavelength, and the small pulse width. In addition, there is a need for the groove which is formed in the groove forming step to have a depth which reaches the multilayered nitride semiconductor layer 2.

In addition to the above configuration, the groove forming step employs the laser beam to form the cutting groove 6. However, the means for forming the groove is not limited to the laser. That is to say, it is possible to employ the means of forming the groove by such as dicing saw and dry etching apparatus. However, in a case where the groove is formed by the laser beam, the laser beam may be combined with the galvanometric mirror. Consequently, it is possible to form the groove 6 along an arbitrary direction at high speed. Therefore, this configuration makes it possible to form the groove 6 in a short time, compared with the case of forming the groove 6 by the dicing saw and the dry etching apparatus. In addition, when the laser beam is used, it is possible to form the groove having the width of 20 μm to 40 μm. Therefore, it is possible to form the groove having the narrow width. Consequently, it is possible to obtain more semiconductor light emitting element A from one supporting wafer 30. This results in the reduction of the cost of the semiconductor light emitting element A.

Subsequent to the groove forming step, the light applying step of applying the light to the lower surface of the multilayered nitride semiconductor layer 2 through the transparent crystal wafer 1. Subsequent to the light applying step, the separating step of separating the transparent crystal wafer 1 from the multilayered nitride semiconductor layer 2 is performed. Subsequently, the second electrode forming step of forming the cathode electrode 42 on the lower surface of the multilayered nitride semiconductor layer 2; the lower surface of the multilayered nitride semiconductor layer 2 is opposite of the supporting wafer 30 from the multilayered nitride semiconductor layer 2. Subsequently, the adhesive resin tape 8 is attached to the supporting wafer 30. Subsequently, as shown in FIG. 1 (e), the dicing groove forming step of forming the dicing groove 7 is performed. The dicing groove 7 is formed along the groove 6, and has a depth of about half of the thickness of the supporting wafer 30. In the light applying step, the laser beam LB having the ultraviolet light LB is applied to the lower surface of the multilayered nitride semiconductor layer 2 through the transparent crystal wafer. The laser beam LB is defined as a first light. Consequently, the buffer layer 21 is dissolved Ga and N. When GaN is dissolved into Ga and N, N$_2$ gas is generated. The N$_2$ gas is discharged through the groove 6. Therefore, according to the gas pressure of N$_2$ gas, it is possible to prevent the crack of the micrometer order in the n-type nitride semiconductor layer 22. In contrast, the lower surface of the multilayered nitride semiconductor layer 2 is dissolved into Ga and N, the bonding force between the multilayered nitride semiconductor layer 2 and the transparent crystal wafer 1 is reduced. When the bonding force between the multilayered nitride semiconductor layer 2 and the transparent crystal wafer 1 is reduced, it is possible to separate the transparent crystal wafer 1 from the multilayered nitride semiconductor layer 2. Therefore, in the separating step, the transparent crystal wafer 1 is easily separated. When the transparent crystal wafer 1 is separated from the multilayered nitride semiconductor layer 2, Ga is remained on the surface of the multilayered nitride semiconductor layer 2 and the inside surface of the cutting groove. It is possible to remove Ga by immersing into the hydrochloric acid solution (for example, hydrochloric acid of 50%) about one minute. In addition, Ga has a melting point of about 30 degree C. Therefore, even if it is impossible to remove the transparent crystal wafer 1, it is possible to separate the transparent crystal wafer 1 by melting Ga in the boundary by the hot plate. (disposing the supporting wafer 30 on the hot plate to melt Ga) Consequently, it is possible to easily separate the transparent crystal wafer 1.

By the way, in the light applying step, the light applied to the lower surface of the multilayered nitride semiconductor layer 2 through the transparent crystal wafer 1 is a laser beam LB which has an ultraviolet light having a photon energy which is greater than the photon energy of the visible light. The laser beam LB has an irradiation energy of 0.18 J/cm$^2$.

In the light applying step, the KrF excimer laser beam having a wavelength of 248 nm is used in order to apply the ultraviolet light. However, the laser beam which is used for applying the ultraviolet light is not limited to KrF. As to the laser beam of applying the ultraviolet light, XeCl excimer laser having a wavelength of 308 nm, tripled YAG laser having the wavelength of 355 nm, quadrupled YAG laser having a wavelength of 266 nm, and quintuple YAG laser having the wavelength of 213 nm. That is, the laser beam LB is selected according to the material and thickness of the transparent crystal wafer 1 and the multilayered nitride semiconductor layer 2.

In addition, in the second electrode forming step, the second resist layer having a forming for exposing an area where "the cathode electrode 42 is to be formed" is prepared by the photolithography technology. Subsequently, the cathode electrode 42 is prepared by the electron beam evaporation method. Subsequently, the second resist layer and the unnecessary film on the second resist layer are removed by the liftoff step.

Subsequent to the dicing groove forming step, as shown in FIG. 1 (f), a dividing step of dividing the semiconductor light emitting elements A into individual semiconductor light emitting element A by using the breaking apparatus is performed. The breaking apparatus is commonly known. Subsequently, the expanding step of expanding the dicing sheet 8 is performed. Subsequently, the semiconductor light emitting element A is picked up, whereby the individual light emitting elements A shown in FIG. 1 (g) are obtained. In this embodiment, the dicing groove forming step and dividing step are defined as the dicing step of dicing along the groove 6.

As would be understood from the above explanation, the method of manufacturing the semiconductor light emitting element A in this embodiment comprises the semiconductor layer forming step, the bonding step, the groove forming step, the light applying step, the separating step, and the cutting step. In the semiconductor layer forming step, the multilayered nitride semiconductor layer 2 is prepared on the upper surface of the transparent crystal wafer 1 by the crystal growth. In the bonding step, the multilayered nitride semiconductor layer 2 and the upper surface of the supporting wafer 30 are joined. In this groove forming step, the groove is formed along the center line of the area corresponding to the scribe lane such that the groove has a depth extends from the lower surface of the transparent crystal wafer 1 to the multilayered nitride semiconductor layer 2. In the light applying step, the laser beam LB is applied to the lower surface of the multilayered nitride semiconductor layer through the transparent crystal wafer 1. When the lower surface of the multilayered nitride semiconductor layer 2 receives the laser beam LB, GaN in the lower surface of the multilayered nitride semiconductor layer 2 is dissolved into Ga and N, whereby $N_2$ is generated. The generated $N_2$ is discharged to the outside through the groove 6. Consequently, it is possible to prevent the crack having the micrometer order to the multilayered nitride semiconductor layer 2. In addition to the above steps, the multilayered nitride semiconductor layer 2 and the supporting wafer 30 are joined, and subsequently the groove 6 is formed. Therefore, the multilayered nitride semiconductor layer 2 and the supporting wafer 30 are securely joined. That is, the multilayered nitride semiconductor layer 2 and the supporting wafer 3 are securely joined. In contrast, when GaN in the lower surface of the multilayered nitride semiconductor layer 2 is dissolved, the bonding force establishing the physical joint between the multilayered nitride semiconductor layer and the transparent crystal wafer 1 is removed. When the bonding force which establishes the physical joint is removed, the transparent crystal wafer 1 is separated from the multilayered nitride semiconductor layer 2 in the separating step.

Second Embodiment

The method of manufacturing the semiconductor light emitting element A in this embodiment is approximately same as the method of manufacturing the semiconductor light emitting element A in the first embodiment. Therefore, the explanation of the step different from the steps of the first embodiment is made. It is noted that the configurations same as the configurations in the first embodiment are symbolized by the same reference numerals.

Figure 2A:
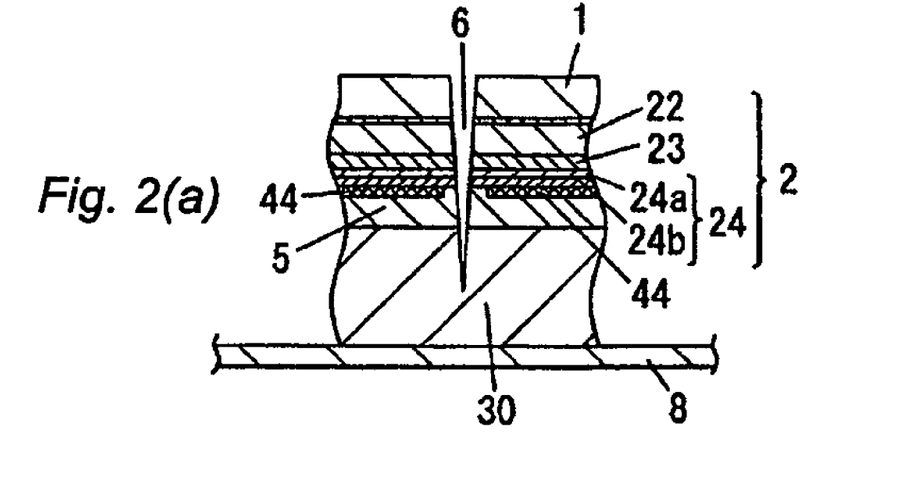

This embodiment further includes a polishing step and an adhering step, in addition to the steps in the first embodiment. The polishing step is performed after the bonding step. In the polishing step, the lower surface of the transparent crystal wafer 1 is polished, whereby the transparent crystal wafer 1 is thinned. The adhering step is performed after the polishing step. In the adhering step, the dicing sheet 8 is adhered to the supporting wafer 30. Subsequent to the adhering step, the groove forming step is performed. In the groove forming step, as shown in FIG. 2 (a), the groove is formed to have a depth which extends from the lower surface of the transparent crystal wafer 1 to the mid portion of the supporting wafer 30. It is noted that this embodiment discloses the polishing step of polishing the transparent crystal wafer 1 to a thickness of 100 μm. The groove 6 has a depth of 250 μm. The groove 6 has a width of 30 μm. However, these values are one example. Therefore, these values are not limited thereto.

Figure 2B:
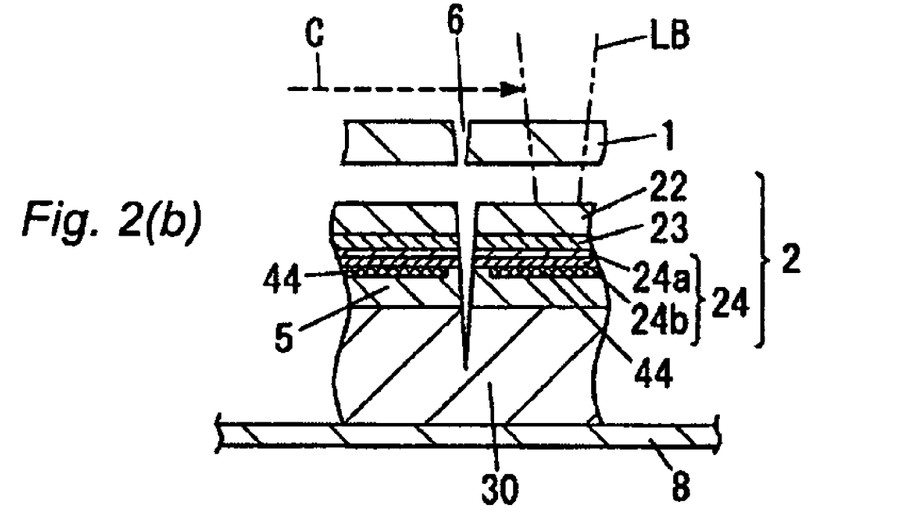

After the cutting groove forming step, similar to the first embodiment, the light applying step is applied, whereby the light beam LB is applied and swept from the second surface 200 of the transparent crystal wafer 1. The arrow C in FIG. 2 (b) shows the sweeping direction of the laser beam LB. Subsequently, the separating step of separating the transparent crystal wafer 1 is performed, whereby the structure shown in FIG. 2 (b) is obtained.

In this manner, according to the method of manufacturing the semiconductor light emitting element A in this embodiment, in the dicing step explained in the first embodiment, it is possible to omit the form the dicing groove 7 to the supporting wafer 30 in the dicing step. Consequently, it is possible to simplify the dicing step.

Third Embodiment

The method of manufacturing the semiconductor light emitting element A in this embodiment is approximately similar to the first embodiment. Therefore, in this embodiment, the characteristic step is explained with using FIG. 3. It is noted that the configuration same as the configuration of already explained in the first embodiment is symbolized by the same reference numerals of the first embodiment.

Figure 3A:
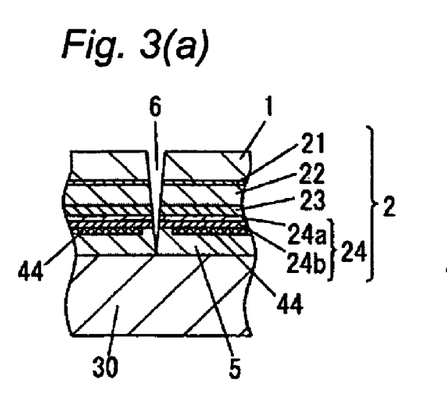
Figure 3B:
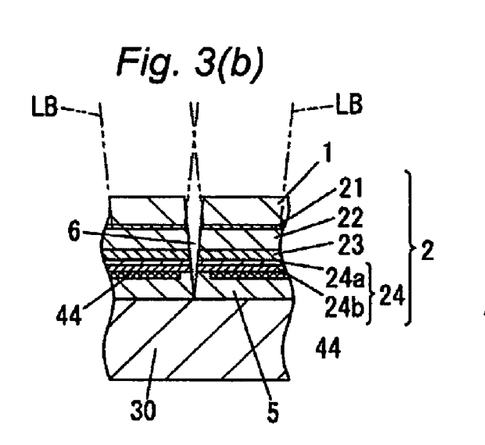

The method of manufacturing the semiconductor light emitting element in this embodiment comprises the polishing step, in addition to the steps in the first embodiment. The polishing step is performed after the bonding step. In the polishing step, the transparent crystal wafer 1 is polished, whereby the transparent crystal wafer 1 is thinned. Subsequent to the polishing step, the groove forming step is performed. In the groove forming step, as shown in FIG. 3 (a), the groove 6 is formed such that the groove 6 having a depth which extends from the lower surface of the transparent crystal wafer 1 to the supporting wafer 30. In addition, in the polishing step of this embodiment, the transparent crystal wafer 1 having a thickness of 100 μm is employed. However, this numerical value is one example, whereby the this numerical value is not limited to the above example.

Figure 4:
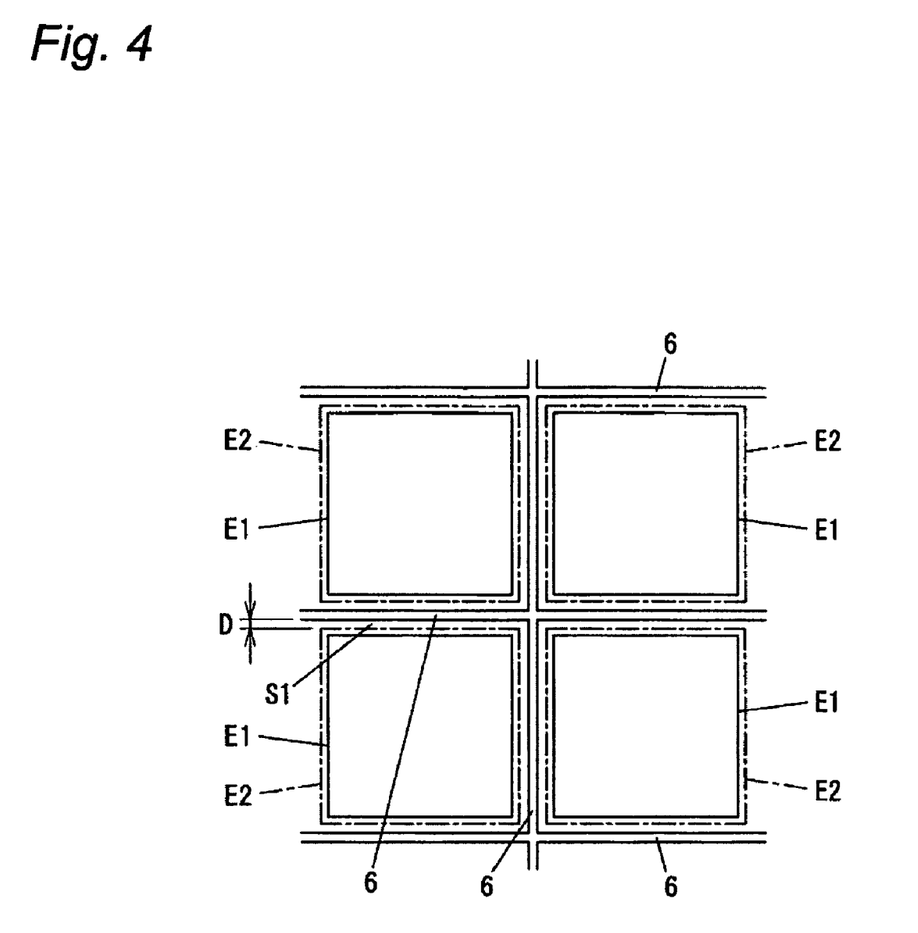
FIG. 4 shows an explanation view showing the method of manufacturing the semiconductor light emitting element of the above.
Figure 5:
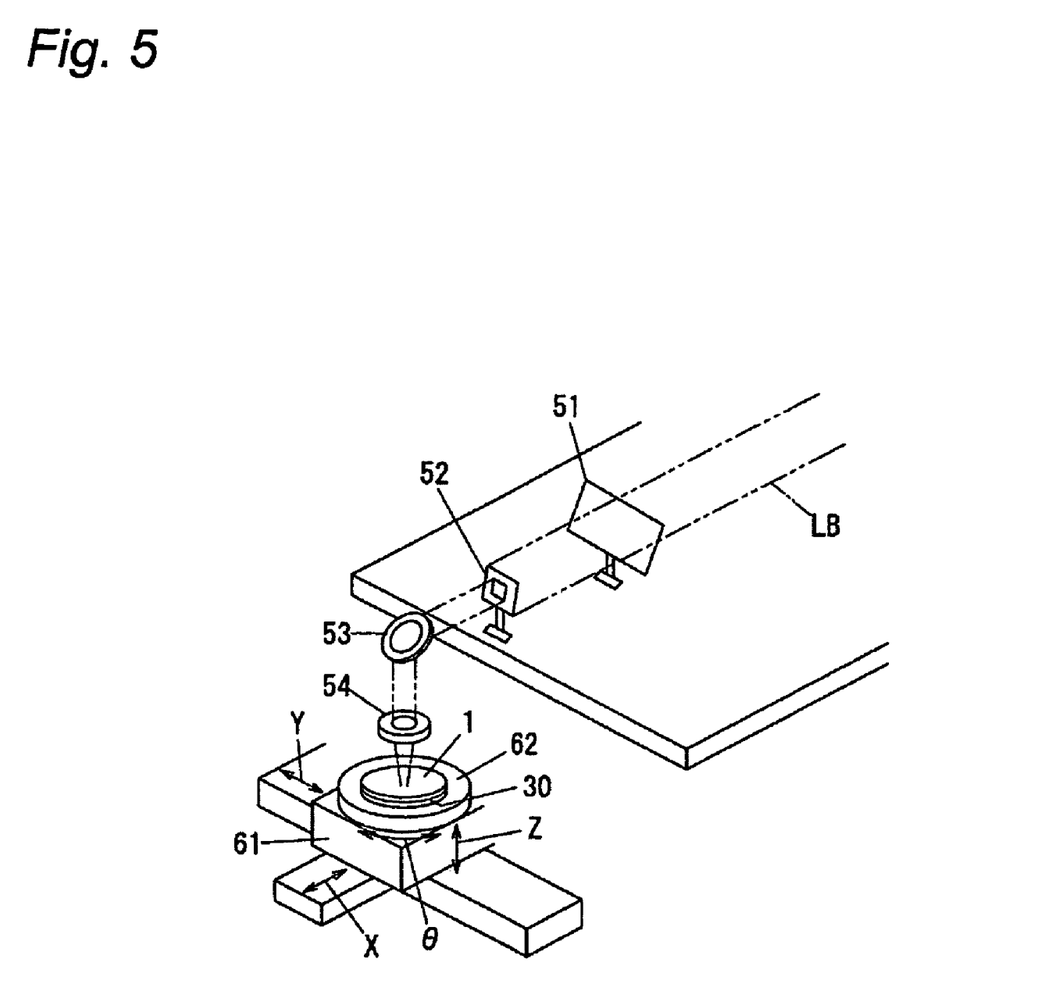
FIG. 5 shows an explanation view showing the method of manufacturing the semiconductor light emitting element of the above.

In addition, in the light applying step, as shown in FIG. 3 (b) an FIG. 4, the light applying area E2 for applying the laser light LB is provided to each the element forming area E1 of the semiconductor light emitting element A. Then, the laser beam LB is applied to the area which is spaced from the groove 6 by a predetermined distance. That is, the buffer layer includes the light applied area where the laser beam LB is applied, and the light non-applied area S1 where the laser beam LB is not applied. The light non-applied area S1 where the laser beam LB is not applied is provided along the groove 6. Furthermore, the light non-applied area S1 has a width center which corresponds to the width center of the groove 6. The light non-applied area S1 has the width which is greater than the width of the groove 6.

In the light applying step, the laser beam LB is produced by the laser processing system shown in FIG. 4, and applied to the second surface of the transparent crystal wafer 1. The laser processing system is the optical system comprises an attenuator 51, the focusing mask 52, the fixed mirror 53, and the fixed collective lens 54. The attenuator 51 is configured to adjust the energy density of the laser beam LB at the processing point from the laser realized by KrF excimer laser (not shown). The focusing mask 52 is configured to form the light applied area of the laser beam LB (in other words, is configured to adjust the profile of the laser beam LB) and is configured to use a portion having the uniform energy distribution of the laser beam LB (in other words, is configured to use a portion having a good quality). The fixed mirror 53 is configured to reflect the laser beam LB to vary the traveling direction of the laser beam LB. The fixed collective lens 54 is configured to collect the laser beam LB. In this manner, the laser processing system is configured to apply the laser beam LB to the second surface of the transparent crystal wafer. In addition to the above configuration, the laser processing system comprises the four axes processing table 61 and the control unit (not shown). The four axes processing table 61 is configured to move the processing stage 62 mounting the supporting wafer 30, whereby the four axes processing allows the processing stage 62 to be movable toward the four axes (x axis, y axis, z axis, and θ axis). The microcomputer holds the program which allows the four axes processing table 61 to control. Consequently, the processing stage 62 is configured to be operated in a stepwise fashion.

The light applying step is further explained hereinafter. In the light applying step, the first step and the second step is performed; in the first step, according to the element forming area E1 of one semiconductor light emitting element A, the laser beam LB is applied to the light applied area E2 which is slightly greater than the element forming area E1; in the second step, the processing stage 62 is moved by a distance which is equal to an arrangement pitch between the semiconductor light emitting element A (in this embodiment, the arrangement pitch of the semiconductor light emitting element A is equal to the arrangement pitch of the anode electrodes 44.) The first step and the second step are alternately and repeatedly performed. Consequently, the laser light LB is applied to all the light applied area E2. In these steps, as will be understood from FIG. 4, the cutting groove 6 is formed along a center of the scribe lane. Therefore, the light applied area E2 is determined such that the cutting groove 6 is displaced from the light applied area E2.

Figure 3C:
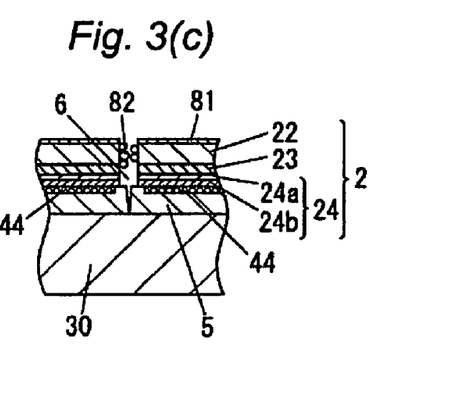

According to the first step and the second step are performed repeatedly, the laser beam LB is applied to the entire light applied area E2. Then, the supporting wafer 30 is disposed on the hot plate so as to apply heat to the supporting wafer 30, whereby the transparent crystal wafer 1 is separated. According to this step, the structure shown in FIG. 3 (c) is obtained. In the multilayered nitride semiconductor layer 2, the area corresponding to the light non-applied area S1 has a size which is extremely smaller than the entire size of the multilayered nitride semiconductor layer 2. Therefore, it is possible to separate the transparent crystal wafer 1. It is noted that, in the multilayered nitride semiconductor layer 2, a portion corresponding to the light non-applied area S1 is remained on the transparent crystal wafer 1, or is crushed by the gas pressure of the $N_2$. Therefore, the transparent crystal wafer 1 is easily separated from the multilayered nitride semiconductor layer 2. In addition, the circumjacent portion of the cutting groove 6 corresponding to the light non-applied area S1 is removed from the transparent crystal wafer 1.

Figure 3D:
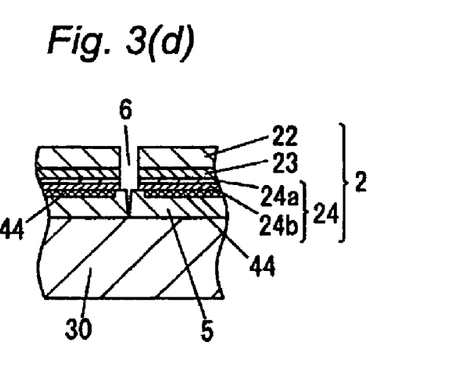

After the transparent crystal wafer 1 is separated, the Ga 81 of metal and the dust (which is generated due to the crush of the GaN) in the cutting groove 6 remained on the surface of the multilayered nitride semiconductor layer 2 is removed by the hydrochloric acid solution (such as hydrochloric acid of 50 percent concentration). Consequently, the structure in FIG. 3 (d) is obtained.

In contrast, in the groove forming step, when the laser beam LB is applied, the heat due to the laser beam evaporates a part of the bonding layer made of the electrical conductive material. As a result, there is a possibility that a part of the electrical conductive material is adhered to and remained on the inside surface of the groove 6. In this case, when the semiconductor light emitting element A is operated, the multilayered nitride semiconductor layer 2 is provided at its side surface with excrescence which causes the electrical leakage.

However, in the method of manufacturing the semiconductor light emitting element A in this embodiment, even if the leak path causation is adhered to the cutting groove 6 in the cutting groove forming step, and causes the electrical leak, it is possible to remove the leak path causation on the unnecessary portion (corresponding to the light non-applied area S1) with removing the transparent crystal wafer 1 in the separating step.

In addition, in FIG. 4, it is desirable that the distance D between the cutting groove 6 and the light applied area E2 is set to have 10 to 30 μm. In a case where the distance D is shorter than 10 μm, there is a possibility of that the laser beam LB is applied to the portion corresponding to the cutting groove due to the displacement of the processing stage 62. Consequently, there is a possibility of displacing the area where the laser beam is to be applied. In contrast, in a case where the distance D is longer than 30 μm, there is a possibility that it is impossible to obtain the relaxation effect of relaxing $N_2$ gas pressure. That is to say, as the distance D is shorter, GaN in the light non-applied area S1 is easily pushed out by the $N_2$ gas pressure. The dust caused by GaN which is pushed out is etched by the hydrochloric acid. In addition, as to one example, in a case where the element forming area E1 of 930 μm$^2$, the width of the scribe lane of 70 μm, the light applied area E2 of 950 μm, the width of the cutting groove 6 of 30 μm, and the distance D of 10 μm is set, the transparent crystal wafer 1 and the unnecessary portion are removed as intended.

Fourth Embodiment

The method of manufacturing the semiconductor light emitting element A (shown in FIG. 1 (g)) in this embodiment is approximately same as that in the third embodiment. Therefore, characteristic step is explained on the basis of FIG. 6. It is noted that the configurations same as the configurations of the third embodiment are symbolized by the same reference numerals.

Figure 6:
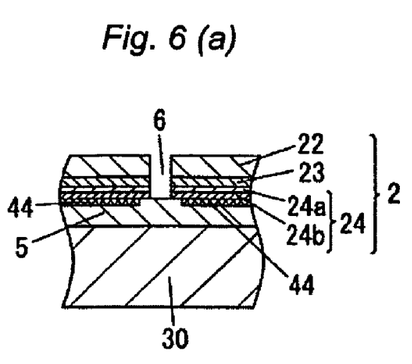

In this embodiment, the groove 6 having the depth reaches the bonding layer 5 is formed in the groove forming step. Then, the separating step is performed, whereby the structure shown in FIG. 6 (a) is obtained. Subsequently, as will be understood from FIG. 6 (d), the electrical insulation film forming step of forming the electrical insulation film made of silicon dioxide film is prepared on an inside surface of the groove 6. Subsequent to the electrical insulation film forming step, the dicing step is performed.

In the electrical insulation film forming step, the third resist layer 71 is prepared on the surface of the multilayered nitride semiconductor layer 2 with using the photolithograph technique; the third resist layer 71 has an opening which defines the area where the electrical insulation film 71 is to be formed. According to this step, the structure shown in FIG. 6 (b) is obtained. Subsequently, the electrical insulation film 71 which is realized by the silicon dioxide film having a predetermined thickness (such as 100 nm) is prepared by using the electron beam evaporation method. Subsequently, the third resist layer and the unnecessary film 71 on the third resist layer is removed by the ultrasonic cleaning process with using the organic solvent (such as acetone). (That is, the third resist layer and the unnecessary film 71 is lifted off.)

By the way, when the dicing groove forming step, after the separating step, of forming the dicing groove 7 is performed by the laser beam, a part of the bonding layer 5 made of the electrical conductive material is evaporated due to the heat caused due to the application of the laser beam. As a result, the excrescence is adhered to and removed on the inside surface of the dicing groove 7. The excrescence on the surface of the multilayered nitride semiconductor layer 2 acts as the leak path causation when the semiconductor light emitting element A is operated. As a result, the electrical current leakage and the electrical short circuit are caused.

However, according to the method of manufacturing the semiconductor light emitting element A in this embodiment, the side surface of the multilayered nitride semiconductor layer 2 exposed in the cutting groove forming step is covered by the electrical insulation film 71, prior to the dicing step. In the dicing groove forming step, the width of the dicing groove 7 is set such that the electrical insulation film 71 is remained on the side surface of the multilayered nitride semiconductor layer 2. Consequently, it is possible to cover the side surface of the multilayered nitride semiconductor layer 2 by the electrical insulation film 71, and also possible to prevent the exposure of the side surface of the multilayered nitride semiconductor layer 2. It is possible to prevent the electrical current leakage of the semiconductor light emitting element A due to the foreign matter adhered to the side surface of the multilayered nitride semiconductor layer 2. In addition, the electrical insulation film 71 is not limited to the silicon dioxide. The electrical insulation film 71 is exemplified by the silicon nitride film.

By the way, in the above embodiment, the semiconductor light emitting element A is explained on the basis of the light emitting diode being configured to emit the visible light. However, it is possible to employ the light emitting diode being configured to emit the ultraviolet light and the light emitting diode being configured to emit the infrared light, instead of the light emitting diode being configured to emit the visible light.

The invention claimed is:

1. A method of manufacturing a semiconductor light emitting element comprising following steps of:
   (a) forming a multilayered nitride semiconductor layer on a first surface of a first wafer which is configured transmit a first light,
       said first wafer having the first surface and a second surface which is opposite of said first surface,
       the multilayered nitride semiconductor layer comprising a first nitride semiconductor layer, and a second nitride semiconductor layer,
       said first nitride semiconductor layer having a type of n-type or p-type,
       said second nitride semiconductor layer being disposed on the first nitride semiconductor layer,
       said second nitride semiconductor layer has a type which is opposite of the type of the first nitride semiconductor layer,
       said multilayered nitride semiconductor layer has a third surface which is faced with the second surface;
   (b) bonding a second wafer on the multilayered nitride semiconductor layer, said step of bonding a second wafer being performed after said step of forming a multilayered nitride semiconductor layer,
   (c) forming a groove having a depth extends from the second surface of said first wafer to at least said multilayered nitride semiconductor layer,
       said step of forming the groove having a depth being performed after said step of bonding a second wafer on the multilayered nitride semiconductor layer;
   (d) applying the first light to the third surface of the multilayered nitride semiconductor layer through the first wafer so as to dissolve a nitride semiconductor located in said third surface of said multilayered nitride semiconductor layer,
       when said nitride semiconductor in the third surface of the multilayered nitride semiconductor layer is dissolved, said nitride semiconductor in the third surface generates a nitrogen gas,
       said nitrogen gas being discharged to an outside through said groove,
       when said nitride semiconductor in the third surface of the multilayered nitride semiconductor layer is dissolved, a bonding force between said multilayered nitride semiconductor layer and said first wafer being decreased;
   (e) separating said first wafer from said first nitride semiconductor layer; and
   (f) cutting said first nitride semiconductor layer, said second nitride semiconductor layer, and said second wafer along said groove so as to be divided into a plurality of semiconductor light emitting element,
       said step of cutting said first nitride semiconductor layer being performed after said step of separating said first wafer.

2. The method of manufacturing the semiconductor light emitting element as set forth in claim 1, wherein
   when said step of forming the groove is performed, the groove having the depth to extends to the second wafer is formed.

3. The method of manufacturing the semiconductor light emitting element as set forth in claim 1, wherein
   when said step of forming the groove is performed, the groove is formed by applying a laser beam.

4. The method of manufacturing the semiconductor light emitting element as set forth in claim 1, wherein
   when said step of applying the first light is performed, the first light is applied to an area spaced from the groove by a predetermined distance.

5. The method of manufacturing the semiconductor light emitting element as set forth in claim 1, further comprising a step of:
   (g) forming an electrical insulation film on an inside surface of said groove, said step of forming the electrical insulation film being performed after the first wafer is removed,
       said step of cutting said first nitride semiconductor layer being performed after forming said electrical insulation film.

6. The method of manufacturing the semiconductor light emitting element as set forth in claim 1, wherein
   said second wafer having a plurality of element forming areas and scribe lane area,
   said scribe lane dividing one of said element forming area from the other of said element forming area,
   wherein
   when said step of forming the groove being performed, said groove is formed along a center line which passes along a width center of said scribe lane area.

7. The method of manufacturing the semiconductor light emitting element as set forth in claim 1, wherein
   said multilayered nitride semiconductor layer further comprises a buffer layer, said buffer layer being made of a nitride semiconductor,
   when the multilayered nitride semiconductor layer being formed, said buffer layer being located on the first wafer,
   when the multilayered nitride semiconductor layer being formed, said first nitride semiconductor layer being disposed on an upper surface of the buffer layer, said buffer layer having a lower surface which is defined as the third surface of said multilayered nitride semiconductor layer.

8. The method of manufacturing the semiconductor light emitting element as set forth in claim 7, wherein
said buffer layer is made of gallium nitride.

9. The method of manufacturing the semiconductor light emitting element as set forth in claim 1, wherein
said first light is an ultraviolet light.

10. The method of manufacturing the semiconductor light emitting element as set forth in claim 1, wherein
said multilayer nitride semiconductor layer has a plurality of first area and a second area,
a plurality of said first areas corresponding to a plurality of said semiconductor light emitting element,
said second area dividing each one of said first area from the other of said first area, wherein
the first light is applied to the first area so as not to be applied to the second area, said second area having non-light-applied-width which has a center corresponding to a center of the width of the groove, and
said non-light-applied-width is greater than the width of the groove.

11. The method of manufacturing the semiconductor light emitting element as set forth in claim 2, wherein
when said step of forming the groove is performed, the groove is formed by applying a laser beam.

12. The method of manufacturing the semiconductor light emitting element as set forth in claim 2, wherein
when said step of applying the first light is performed, the first light is applied to an area spaced from the groove by a predetermined distance.

13. The method of manufacturing the semiconductor light emitting element as set forth in claim 2, further comprising a step of:
(g) forming an electrical insulation film on an inside surface of said groove, said step of forming the electrical insulation film being performed after the first wafer is removed,
said step of cutting said first nitride semiconductor layer being performed after forming said electrical insulation film.

14. The method of manufacturing the semiconductor light emitting element as set forth in claim 2, wherein
said second wafer having a plurality of element forming areas and scribe lane area,
said scribe lane dividing one of said element forming area from the other of said element forming area,
wherein
when said step of forming the groove being performed, said groove is formed along a center line which passes along a width center of said scribe lane area.

15. The method of manufacturing the semiconductor light emitting element as set forth in claim 5, wherein
said second wafer having a plurality of element forming areas and scribe lane area,
said scribe lane dividing one of said element forming area from the other of said element forming area,
wherein
when said step of forming the groove being performed, said groove is formed along a center line which passes along a width center of said scribe lane area.

16. The method of manufacturing the semiconductor light emitting element as set forth in claim 2, wherein
said multilayered nitride semiconductor layer further comprises a buffer layer, said buffer layer being made of a nitride semiconductor,
when the multilayered nitride semiconductor layer being formed, said buffer layer being located on the first wafer,
when the multilayered nitride semiconductor layer being formed, said first nitride semiconductor layer being disposed on an upper surface of the buffer layer,
said buffer layer having a lower surface which is defined as the third surface of said multilayered nitride semiconductor layer.

17. The method of manufacturing the semiconductor light emitting element as set forth in claim 6, wherein
said multilayered nitride semiconductor layer further comprises a buffer layer, said buffer layer being made of a nitride semiconductor,
when the multilayered nitride semiconductor layer being formed, said buffer layer being located on the first wafer,
when the multilayered nitride semiconductor layer being formed, said first nitride semiconductor layer being disposed on an upper surface of the buffer layer,
said buffer layer having a lower surface which is defined as the third surface of said multilayered nitride semiconductor layer.

18. The method of manufacturing the semiconductor light emitting element as set forth in claim 2, wherein
said first light is an ultraviolet light.

19. The method of manufacturing the semiconductor light emitting element as set forth in claim 2, wherein
said multilayer nitride semiconductor layer has a plurality of first area and a second area,
a plurality of said first areas corresponding to a plurality of said semiconductor light emitting element,
said second area dividing each one of said first area from the other of said first area, wherein
the first light is applied to the first area so as not to be applied to the second area,
said second area having non-light-applied-width which has a center corresponding to a center of the width of the groove, and
said non-light-applied-width is greater than the width of the groove.

20. The method of manufacturing the semiconductor light emitting element as set forth in claim 5, wherein
said multilayer nitride semiconductor layer has a plurality of first area and a second area,
a plurality of said first areas corresponding to a plurality of said semiconductor light emitting element,
said second area dividing each one of said first area from the other of said first area, wherein
the first light is applied to the first area so as not to be applied to the second area,
said second area having non-light-applied-width which has a center corresponding to a center of the width of the groove, and
said non-light-applied-width is greater than the width of the groove.

* * * * *